United States Patent
Han (10) Patent No.: US 9,724,725 B2
(45) Date of Patent: Aug. 8, 2017

(54) DEPOSITION APPARATUS AND DEPOSITION METHOD USING THE SAME

(71) Applicant: Samsung Display Co., Ltd., Yongin-si, Gyeonggi-do (KR)

(72) Inventor: Jeong Won Han, Seongnam-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/967,053

(22) Filed: Dec. 11, 2015

(65) Prior Publication Data
US 2016/0207066 A1 Jul. 21, 2016

(30) Foreign Application Priority Data
Jan. 21, 2015 (KR) .................. 10-2015-0010126

(51) Int. Cl.
B05D 1/32 (2006.01)
B05C 21/00 (2006.01)
H01L 51/00 (2006.01)
H01L 21/3213 (2006.01)

(52) U.S. Cl.
CPC ...... *B05C 21/005* (2013.01); *H01L 21/32139* (2013.01); *H01L 51/0011* (2013.01)

(58) Field of Classification Search
None
See application file for complete search history.

(56) References Cited

U.S. PATENT DOCUMENTS

| | | | |
|---|---|---|---|
| 2002/0076847 A1* | 6/2002 | Yamada | C23C 14/042 438/34 |
| 2004/0031442 A1* | 2/2004 | Yamazaki | C23C 14/042 118/727 |

FOREIGN PATENT DOCUMENTS

| | | |
|---|---|---|
| KR | 10-2003-0047284 A | 6/2003 |
| KR | 10-2003-0069679 A | 8/2003 |
| KR | 10-2004-0050045 A | 6/2004 |

(Continued)

OTHER PUBLICATIONS

Samir, Tugrul, "Improving Wafer Temperature Uniformity for Etch Applications," *A Dissertation in Mechanical Engineering*, Submitted to the Graduate Faculty of Texas Tech University, Dec. 2003, 153 pages.

*Primary Examiner* — Joseph Miller, Jr.
(74) *Attorney, Agent, or Firm* — Knobbe Martens Olson & Bear LLP (57) ABSTRACT

A deposition apparatus for manufacturing a display device is disclosed. In one aspect, the apparatus includes a substrate fixing portion configured to fix a deposition substrate to a lower portion thereof and a first mask transfer portion placed on one side of the substrate fixing portion and configured to move the deposition mask upwardly such that the deposition mask is formed spaced apart from the deposition substrate by a predetermined distance. The apparatus also includes a substrate transfer portion configured to move the deposition substrate such that the deposition substrate passes over the deposition mask. The apparatus further includes a mask spacing portion positioned on the substrate fixing portion and configured to maintain a substantially uniform distance between the deposition substrate and the deposition mask when the deposition substrate is moved and a deposition source configured to deposit a deposition material on the deposition substrate through the deposition mask.

15 Claims, 9 Drawing Sheets

(56) References Cited

FOREIGN PATENT DOCUMENTS

| KR | 10-2009-0108420 A | 10/2009 |
|---|---|---|
| KR | 10-2010-0117438 A | 11/2010 |
| KR | 10-1289345 B1 | 7/2013 |

* cited by examiner

DEPOSITION APPARATUS AND DEPOSITION METHOD USING THE SAME

INCORPORATION BY REFERENCE TO ANY PRIORITY APPLICATIONS

This application claims priority to and the benefit of Korean Patent Application No. 10-2015-0010126 filed in the Korean Intellectual Property Office on Jan. 21, 2015, the entire contents of which are incorporated herein by reference.

BACKGROUND

Field

The described technology generally relates to a deposition apparatus and a deposition method using the same.

Description of the Related Technology

Display devices, particularly organic light-emitting diode (OLED) displays, are manufactured by forming thin films on a substrate through deposition. A mask assembly for deposition is typically manufactured using an etching method employing photolithography and electroforming using photolithography and electrolysis. The deposition mask assembly is located on a deposition target, that is, a substrate on which a display device will be formed, and deposition materials are provided to the substrate through a deposition mask so as to form a desired pattern on the substrate.

Recently, small mask scanning (SMS), which is a method of fixing a metal mask with a micropattern on a source and depositing a material on a substrate while scanning the substrate at a predetermined distance from the mask so as to form pixels, has been used for a deposition process for large substrates.

SUMMARY OF CERTAIN INVENTIVE ASPECTS

One inventive aspect relates to a deposition apparatus and a deposition method using the same having advantages of minimizing variation in the deposition position and deposition thickness of a deposition material due to vibration of a metal mask in an SMS deposition process applied to large substrates.

Another aspect is a deposition apparatus, including: a substrate fixing part for fixing a deposition substrate on which a deposition material is deposited to the lower part thereof; a first mask transfer part provided to one side of the substrate fixing part and moving the deposition mask upwardly such that the deposition mask is formed spaced apart from the deposition substrate by a predetermined distance; a substrate transfer part for moving the deposition substrate in the horizontal direction such that the deposition substrate passes over the moved deposition mask; a mask spacing part positioned on the substrate fixing part and maintaining a uniform distance between the deposition substrate and the deposition mask when the deposition substrate is moved; and a deposition source for jetting a deposition material to the deposition substrate through the deposition mask.

The deposition apparatus may further include a first auxiliary substrate provided under the first mask transfer part and arranged side by side with the deposition substrate.

The first auxiliary substrate may be made of the same material as the deposition substrate.

The substrate fixing part may be a bipolar electrostatic chuck.

The first mask transfer part may be a mono-polar electrostatic chuck.

The deposition apparatus may further include a second mask transfer part provided to the other side of the substrate fixing part and moving the deposition mask downwardly from the deposition substrate.

The first and second mask transfer parts may be respectively located before and behind the deposition substrate in a movement direction of the deposition substrate.

The deposition apparatus may further include a second auxiliary substrate provided under the second mask transfer part and arranged side by side with the deposition substrate.

The second auxiliary substrate may be made of the same material as the deposition substrate.

The second mask transfer part may be a mono-polar electrostatic chuck.

The mask spacing part may maintain the distance using magnetic force.

The substrate fixing part may have a larger area than the deposition substrate

Another aspect is a deposition method, including: fixing a deposition substrate on which a deposition material is deposited to a lower part of a substrate fixing part; a first mask transfer part, provided to one side of the substrate fixing part, and moving a deposition mask to a position under the first mask transfer part such that the deposition mask is formed spaced apart from the deposition substrate by a predetermined distance; the substrate fixing part moving the deposition substrate in the horizontal direction such that the deposition substrate passes over the deposition mask; and jetting a deposition material from a deposition source to the deposition substrate through the deposition mask when the deposition mask is moved.

A mask spacing part arranged on the substrate fixing part may maintain a uniform distance between the deposition substrate and the deposition mask when the deposition substrate is moved according to the substrate fixing part.

A first auxiliary substrate may be arranged side by side with the deposition substrate under the first mask transfer part.

The substrate fixing part may be a bipolar electrostatic chuck.

The first mask transfer part may be a mono-polar electrostatic chuck.

The deposition method may further include a second mask transfer part, provided to the other side of the substrate fixing part, and moving the deposition mask downwardly from the deposition substrate after the deposition material is jetted to the deposition substrate.

The second mask transfer part may be a mono-polar electrostatic chuck. The mask spacing part may maintain the distance using magnetic force.

Another aspect is a deposition apparatus for manufacturing a display device, comprising: a substrate fixing portion configured to fix a deposition substrate, on which a deposition material is deposited, to a lower portion thereof; a first mask transfer portion placed on one side of the substrate fixing portion and configured to move a deposition mask upwardly such that the deposition mask is formed spaced apart from the deposition substrate by a predetermined distance; a substrate transfer portion configured to move the deposition substrate in a substantially horizontal direction such that the deposition substrate passes over the deposition mask; a mask spacing portion positioned on the substrate fixing portion and configured to maintain a substantially uniform distance between the deposition substrate and the deposition mask when the deposition substrate is moved;

and a deposition source configured to deposit a deposition material on the deposition substrate through the deposition mask.

The above deposition apparatus further comprises a first auxiliary substrate formed under the first mask transfer portion and arranged side by side with the deposition substrate. In the above deposition apparatus, the first auxiliary substrate is formed of the same material as the deposition substrate. In the above deposition apparatus, the first auxiliary substrate is formed between the first mask transfer portion and the deposition mask. In the above deposition apparatus, the substrate fixing portion comprises a bipolar electrostatic chuck or a mono-polar electrostatic chuck. The above deposition apparatus further comprises a second mask transfer portion formed on another side of the substrate fixing portion and configured to move the deposition mask downwardly from the deposition substrate. In the above deposition apparatus, the first and second mask transfer portions are respectively located on front and rear sides of the deposition substrate in a movement direction of the deposition substrate.

The above deposition apparatus further comprises a second auxiliary substrate formed under the second mask transfer portion and arranged side by side with the deposition substrate. In the above deposition apparatus, the second auxiliary substrate is formed of the same material as the deposition substrate. In the above deposition apparatus, the second mask transfer portion comprises a mono-polar electrostatic chuck. In the above deposition apparatus, the mask spacing portion is configured to maintain the distance based on magnetic force. In the above deposition apparatus, the substrate fixing portion has a larger area than the deposition substrate. The above deposition apparatus further comprises first and second auxiliary substrates formed on opposing sides of the deposition substrate. In the above deposition apparatus, the thicknesses of the first and second auxiliary substrates are substantially the same as that of the deposition substrate.

Another aspect is a deposition method, comprising: fixing a deposition substrate, on which a deposition material is deposited, to a lower part of a substrate fixing portion; moving a deposition mask, via a first mask transfer portion formed on one side of the substrate fixing portion, to a position under the first mask transfer portion such that the deposition mask is formed spaced apart from the deposition substrate by a predetermined distance; moving the deposition substrate, via the substrate fixing portion, in a substantially horizontal direction such that the deposition substrate passes over the deposition mask; and depositing a deposition material from a deposition source to the deposition substrate through the deposition mask when the deposition mask is moved.

The above deposition method further comprises maintaining, via a mask spacing portion arranged on the substrate fixing portion, a substantially uniform distance between the deposition substrate and the deposition mask when the deposition substrate is moved. The above deposition method further comprises arranging a first auxiliary substrate side by side with the deposition substrate under the first mask transfer portion. In the above deposition method, the substrate fixing portion comprises a bipolar electrostatic chuck or a mono-polar electrostatic chuck. The above deposition method further comprises moving the deposition mask, via a second mask transfer portion formed on another side of the substrate fixing portion, downwardly from the deposition substrate after the deposition material is deposited to the deposition substrate. The above deposition method further comprises maintaining, via the mask spacing portion, the distance based on magnetic force.

According to at least one of the disclosed embodiments, variation in a deposition position and deposition thickness in an SMS deposition process applied to large substrates can be minimized.

DETAILED DESCRIPTION OF CERTAIN INVENTIVE EMBODIMENTS

In small mask scanning (SMS) deposition processes, micro-vibration is generated in the metal mask when the metal mask approaches the substrate before the deposition material is jetted from the source to the substrate and thus the deposition position and deposition thickness of the deposition material vary.

Embodiments will be described more fully hereinafter with reference to the accompanying drawings, in which exemplary embodiments of the invention are shown. As those skilled in the art would realize, the described embodiments may be modified in various different ways without departing from the spirit or scope of the present invention. Rather, these embodiments are provided so that this disclosure will be thorough and complete, and will fully convey the scope of the invention to those skilled in the art. Like reference numerals refer to like elements throughout.

In the drawings, the thicknesses of layers, regions, etc., may be exaggerated for clarity. It will be understood that when an element such as a layer, film, region, or substrate is referred to as being "on" another element, it can be directly on the other element or intervening elements may also be present. Like reference numerals designate like elements throughout the specification. In this disclosure, the term "substantially" includes the meanings of completely, almost completely or to any significant degree under some applications and in accordance with those skilled in the art. The term "connected" includes an electrical connection.

Figure 1:
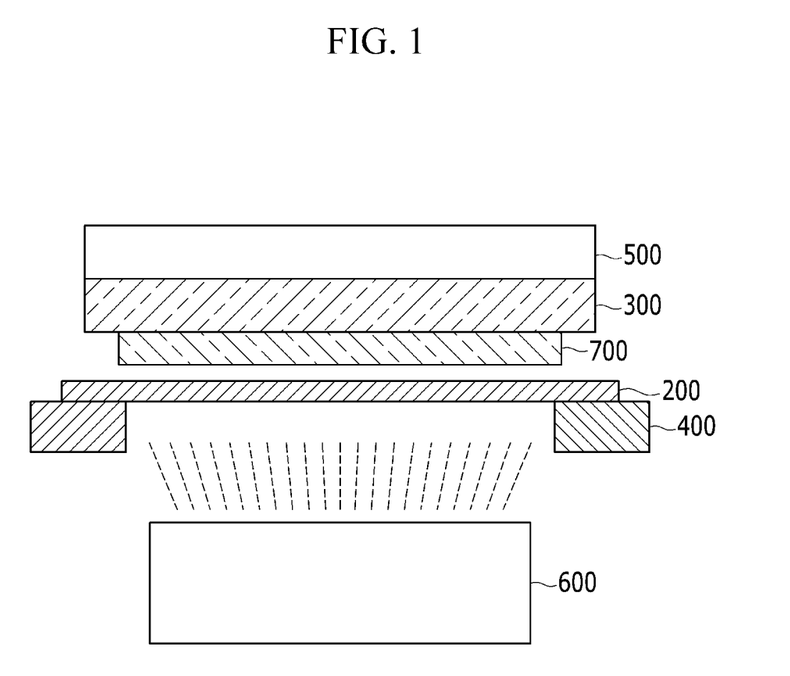
FIG. 1 is a side view of a deposition apparatus according to a first exemplary embodiment.
Figure 2:
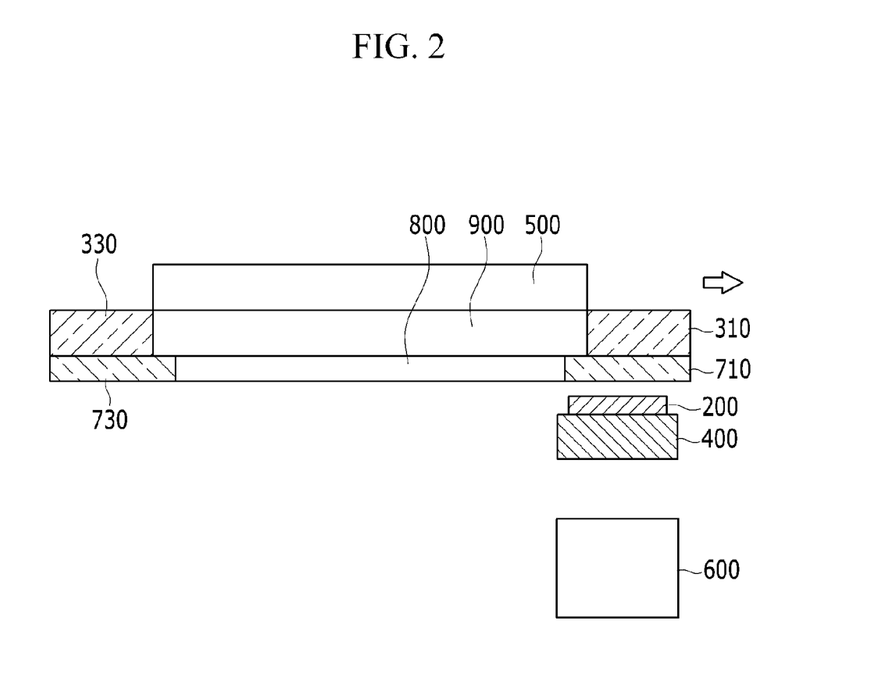
FIG. 2 is a front view of the deposition apparatus according to the first exemplary embodiment.

Referring to FIGS. 1 and 2, a deposition apparatus according to a first exemplary embodiment can restrain generation of vibration in a deposition mask while a deposition substrate passes the deposition mask by pre-locating the deposition mask in front of the deposition substrate in a direction in which the deposition substrate is moved.

Referring to FIGS. 1 and 2, the deposition apparatus includes a substrate fixing part (or portion) 900, a mask transfer part (or portion) 300, a mask spacing part (or portion) 500, a deposition mask 200, a deposition source 600, and an auxiliary substrate 700.

The substrate fixing part 900 fixes a deposition substrate 800 to the lower part thereof. The substrate fixing part 900 fixes the deposition substrate 800 such that a deposition surface of the deposition substrate 800 on which a deposition material is deposited faces down.

In some embodiments, the substrate fixing part 900 passes over the deposition mask 200 together with the deposition substrate 800 during, for example, a deposition process using SMS.

Here, the substrate fixing part 900 may be a bipolar electrostatic chuck. The electrostatic chuck corresponds to a device for fixing a substrate using electrostatic force. The electrostatic chuck can be classified into a bipolar electrostatic chuck and a mono-polar electrostatic chuck according to the number of electrodes.

The bipolar electrostatic chuck can fix a substrate using electrostatic force generated by two electrodes. However, the mono-polar electrostatic chuck generates electrostatic force using one electrode. In the mono-polar electrostatic chuck, a fixed substrate can function as another electrode to generate electrostatic force. That is, in the mono-polar electrostatic chuck, the fixed substrate can correspond to a component of a circuit for generating electrostatic force.

According to the first exemplary embodiment, the deposition substrate 800 is fixed to the substrate fixing part 900 implemented as the bipolar electrostatic chuck.

The substrate fixing part 900 may have a larger area than the deposition substrate 800 fixed to the lower part thereof.

Referring to FIG. 2, the auxiliary substrate 700 may be formed on both sides of the deposition substrate 800. For example, first and second auxiliary substrates 710 and 730 are respectively formed before and behind the deposition substrate 800 in a deposition substrate movement direction. That is, the first auxiliary substrate 710, the deposition substrate 800, and the second auxiliary substrate 730 can be arranged side by side in the deposition substrate movement direction.

The first and second auxiliary substrates 710 and 730 may be formed of the same material as the deposition substrate 800. Here, the first and second auxiliary substrates 710 and 730 may be narrower than the deposition substrate 800.

The mask transfer part 300 may be formed on both sides of the substrate fixing part 900. For example, first and second mask transfer parts 310 and 330 are respectively formed before and behind the substrate fixing part 900 in the deposition substrate movement direction.

Here, the aforementioned first and second auxiliary substrates 710 and 730 may be respectively positioned beneath the first and second mask transfer parts 310 and 330.

According to the first exemplary embodiment, the first mask transfer part 310 moves the deposition mask 200 positioned on a mask frame 400 upwardly so as to locate the deposition mask 200 under the first mask transfer part 310. However, the first mask transfer part 310 may simultaneously or concurrently move the deposition mask 200 and the mask frame 400 upwardly.

Figure 3:
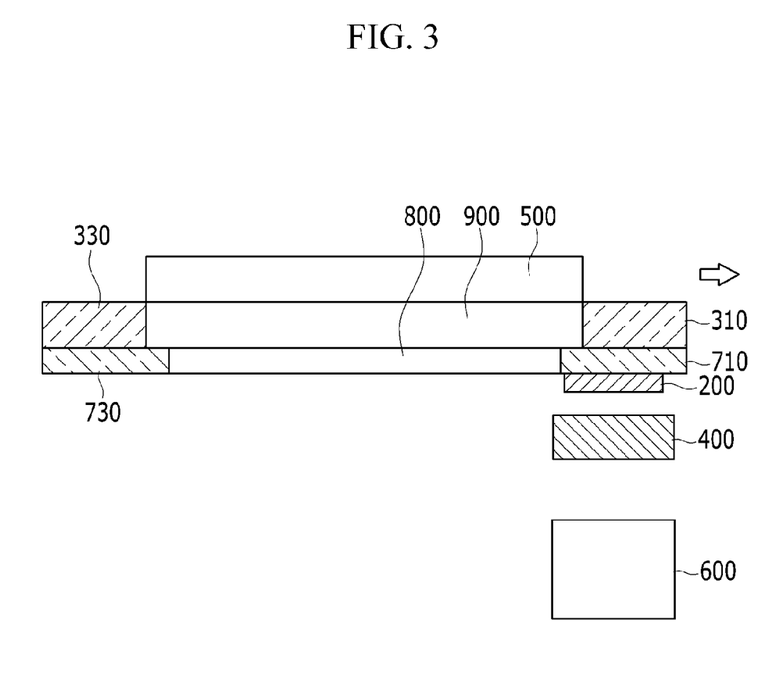
FIGS. 3 and 4 illustrate a deposition process using the deposition apparatus according to the first exemplary embodiment.

In the deposition process using SMS, a deposition material is deposited on the deposition substrate 800 while the deposition substrate 800 passes the deposition mask 200. According to the first exemplary embodiment, the first mask transfer part 310 moves the deposition mask 200 to a position spaced apart from the deposition substrate 800 by a predetermined distance before the deposition substrate 800 passes the deposition mask 200, as shown in FIG. 3.

Here, since the deposition substrate 800 and the first auxiliary substrate 710 are arranged side by side on the same plane, the distance between the deposition substrate 800 and the deposition mask 200 is the same as the distance between the first auxiliary substrate 710 and the deposition mask 200.

The first mask transfer part 310 can move the deposition mask 200 upwardly such that the deposition mask 200 closely contacts the first auxiliary substrate 710.

Here, the first mask transfer part 310 may be a mono-polar electrostatic chuck. As described above, in the case of the mono-polar electrostatic chuck, the deposition mask 200, which is a moving target, functions as an electrode, distinguished from the bipolar electrostatic chuck. Consequently, electrostatic force is generated by one electrode formed in the first mask transfer part 310 and another electrode corresponding to the deposition mask 200.

According to the first exemplary embodiment, the first mask transfer part 310 can move the deposition mask 200 to the aforementioned position by generating electrostatic force. That is, the first mask transfer part 310 can locate the deposition mask 200 in proximity to the deposition substrate 800 before the deposition substrate 800 passes over the deposition mask 200 and moves in the horizontal direction.

It is possible to prevent vibration of the deposition mask 200, generated as the deposition mask 200 abruptly moves downwardly under the deposition substrate 800 when the deposition substrate passes the deposition mask, by pre-locating the deposition mask 200 under the deposition substrate 800, as described above.

A substrate transfer part (not shown) moves the deposition substrate 800 in the horizontal direction. The substrate transfer part can move the deposition substrate 800 in the horizontal direction such that the deposition material can be deposited on the deposition substrate 800 while the deposition substrate 800 moves over the deposition mask 200.

According to the first exemplary embodiment, the substrate transfer part (not shown) transfers the deposition substrate 800 upon arrival of the deposition mask 200 at the aforementioned position by the first mask transfer part 310.

The substrate transfer part (not shown) may move the substrate fixing part 900, the mask spacing part 500, and the first and second mask transfer parts 310 and 330 together with the deposition substrate 800.

Figure 4:
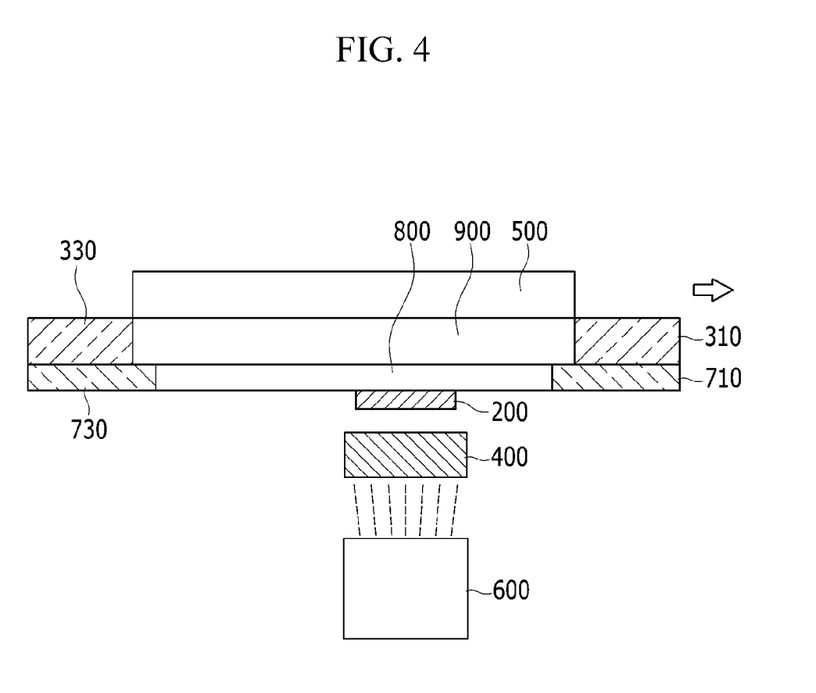

Referring to FIG. 4, when the substrate transfer part moves the deposition substrate 800, the mask spacing part 500 can maintain a uniform distance between the deposition substrate 800 and the deposition mask 200. If the distance between the deposition substrate 800 and the deposition mask 200 is not uniformly maintained, the thickness of a layer formed of the deposition material on the deposition substrate 800 is not uniform.

To prevent this, the mask spacing part 500 maintains the uniform distance between the deposition substrate 800 and the deposition mask 200. Here, the distance between the deposition substrate 800 and the deposition mask 200 may be substantially the same as the distance between the deposition mask 200 moved by the first mask transfer part 310 and the first auxiliary substrate 710.

That is, the deposition mask 200 can be moved upwardly by the first mask transfer part 310 and moved in the horizontal direction while maintaining substantially the same height by the mask spacing part 500.

Here, the mask spacing part 500 can maintain a uniform distance between the deposition mask 200 and the deposition substrate 800 using magnetic force. The mask spacing part 500 is a magnetic member and can maintain the uniform distance between the deposition mask 200 and the deposition substrate 800 by pulling the deposition mask 200 made of a metal toward the deposition substrate 800.

Referring to FIG. 2, the second mask transfer part 330 may be formed at the back of the substrate fixing part 900. The second mask transfer part 330 can move the deposition mask 200 downwardly.

After the deposition substrate 800 passes over the deposition mask 200 while maintaining a predetermined distance from the deposition mask 200, the deposition mask 200 is located behind the substrate fixing part 900. Here, the second mask transfer part 330 moves the deposition mask 200 downwardly.

That is, the second mask transfer part 330 can move the deposition mask 200 to the original position after the deposition material is deposited on the deposition substrate 800.

Here, the second mask transfer part 330 may be a mono-polar electrostatic chuck like the first mask transfer part 310. As described above, in the case of the mono-polar electrostatic chuck, the deposition mask 200 functions as an electrode. Consequently, electrostatic force is generated by one electrode formed in the second mask transfer part 330 and the deposition mask 200.

According to the first exemplary embodiment, the second mask transfer part 330 can move the deposition mask 200 to the original position by controlling electrostatic force. That is, upon completion of movement of the deposition substrate 800 passing over the deposition mask 200 in the horizontal direction, the second mask transfer part 330 separates the deposition mask 200 from the deposition substrate 800.

Here, the second auxiliary substrate 730 is located under the second mask transfer part 330. The second auxiliary substrate 730 is positioned at the back of the deposition substrate 800 in the movement direction of the deposition substrate 800.

The second auxiliary substrate 730 may be formed of the same material as the deposition substrate 800. However, the second auxiliary substrate 730 may be narrower than the deposition substrate 800.

The deposition source 600 is positioned under the deposition mask 200. The deposition source 600 jets the deposition material onto the deposition substrate 800. The deposition material jetted from the deposition source 600 can form a predetermined pattern on the deposition substrate 800 by passing through the deposition mask.

A description will be given of a deposition apparatus according to a second exemplary embodiment with reference to FIG. 5. A detailed description of components identical or similar to those of the deposition apparatus according to the first exemplary embodiment is omitted.

Figure 5:
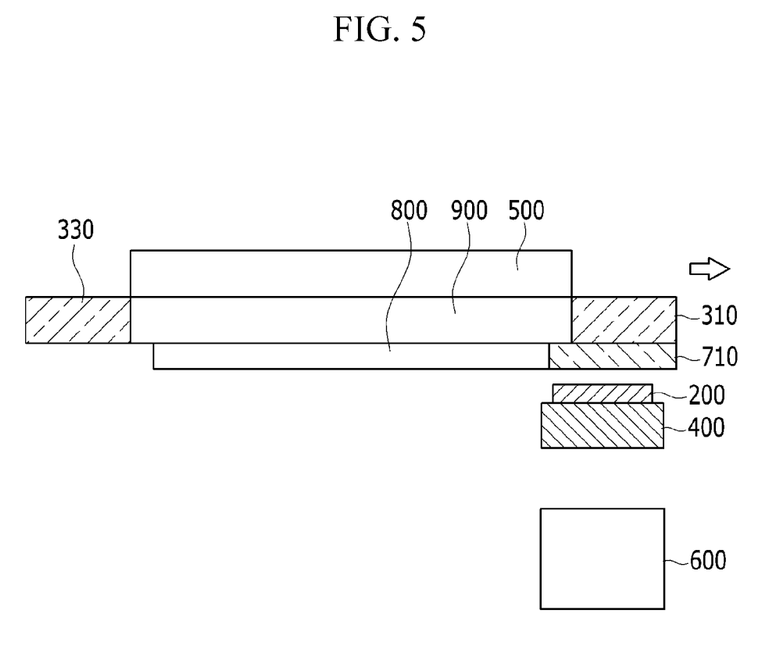
FIG. 5 is a front view of a deposition apparatus according to a second exemplary embodiment.

Referring to FIG. 5, in the deposition apparatus, the mask transfer part 300 may be formed on both sides of the substrate fixing part 900, as in the first exemplary embodiment. That is, the first and second mask transfer parts 310 and 330 can be respectively arranged before and behind the substrate fixing part 900 in the movement direction of the deposition substrate 800.

Here, the first and second mask transfer parts 310 and 330 may be mono-polar electrostatic chucks. As described above, in the case of a mono-polar electrostatic chuck, the deposition mask 200 functions as an electrode. Consequently, electrostatic force is generated by one electrode formed in the first and second mask transfer parts 310 and 330 and the deposition mask 200 corresponding to another electrode.

According to the second exemplary embodiment, only the first auxiliary substrate 710 may be formed before the deposition substrate 800. For example, the first auxiliary substrate 710 and the deposition substrate 800 can be arranged side by side in the movement direction of the deposition substrate 800. That is, the second auxiliary substrate of the first exemplary embodiment is not arranged in the second exemplary embodiment, differently from the first exemplary embodiment.

Here, the deposition substrate 800 and the first auxiliary substrate 710 are arranged side by side on the same plane.

The first auxiliary substrate 710 may be formed of the same material as the deposition substrate 800. However, the first auxiliary substrate 710 may be narrower than the deposition substrate 800.

A description will be given of a deposition apparatus according to a third exemplary embodiment with reference to FIG. 6. A detailed description of components identical or similar to those of the deposition apparatus according to the first exemplary embodiment is omitted.

Figure 6:
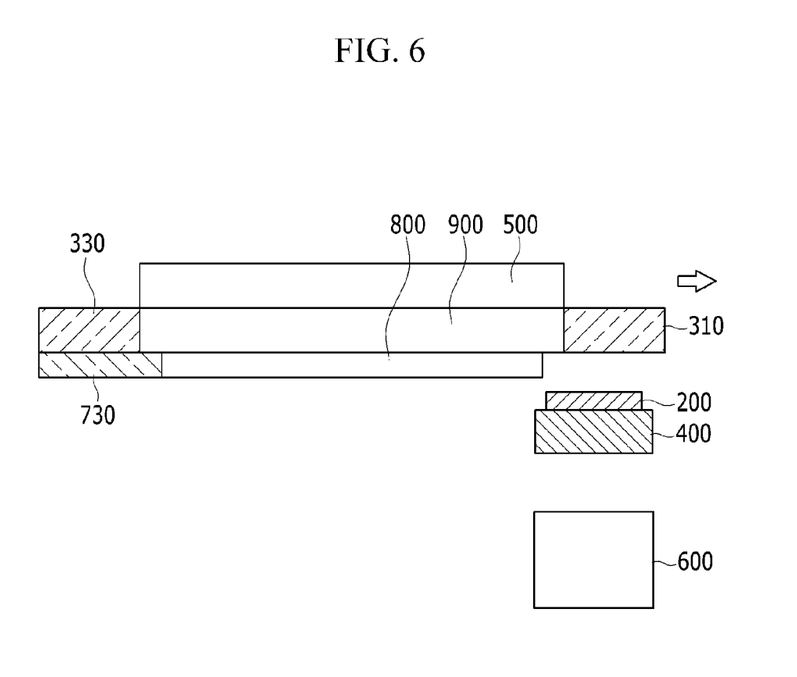
FIG. 6 is a front view of a deposition apparatus according to a third exemplary embodiment.

Referring to FIG. 6, in the deposition apparatus according to the third exemplary embodiment of the present invention, the mask transfer part 300 may be formed on both sides of the substrate fixing part 900, as in the first exemplary embodiment of the present invention. That is, the first and second mask transfer parts 310 and 330 can be respectively arranged before and behind the substrate fixing part 900 in the movement direction of the deposition substrate 800.

Here, the first and second mask transfer parts 310 and 330 may be mono-polar electrostatic chucks. As described above, in the case of a mono-polar electrostatic chuck, the deposition mask 200 functions as an electrode. Consequently, electrostatic force is generated by one electrode formed in the first and second mask transfer parts 310 and 330 and the deposition mask 200 corresponding to another electrode.

According to the third exemplary embodiment, only the second auxiliary substrate 730 may be formed at the back of the deposition substrate 800. For example, the deposition substrate 800 and the second auxiliary substrate 730 can be arranged side by side in the movement direction of the deposition substrate 800. That is, the first auxiliary substrate of the first exemplary embodiment is not arranged in the third exemplary embodiment, differently from the first exemplary embodiment.

Here, the deposition substrate 800 and the second auxiliary substrate 730 are arranged side by side on the same plane.

The second auxiliary substrate 770 may be formed of the same material as the deposition substrate 800. However, the second auxiliary substrate 730 may be narrower than the deposition substrate 800.

A description will be given of a deposition apparatus according to a fourth exemplary embodiment with reference to FIG. 7. A detailed description of components identical or similar to those of the deposition apparatus according to the first exemplary embodiment is omitted.

Figure 7:
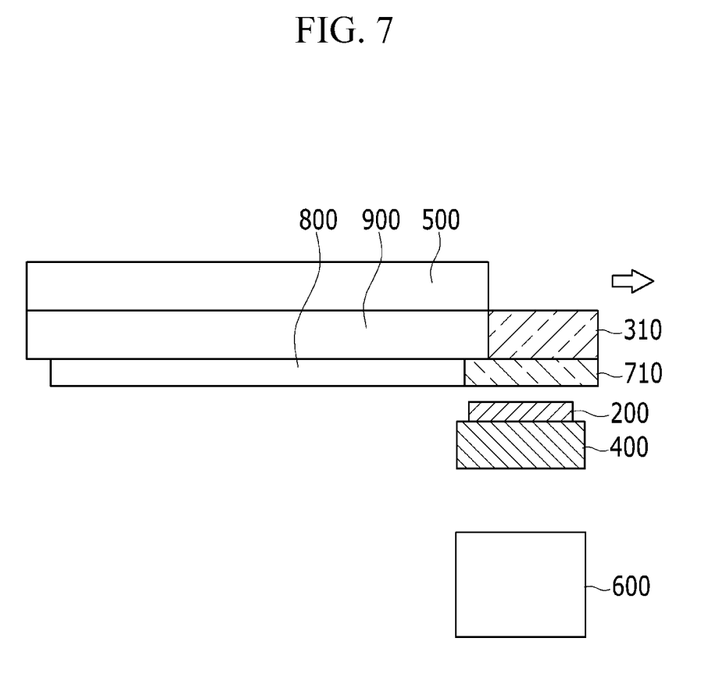
FIG. 7 is a front view of a deposition apparatus according to a fourth exemplary embodiment.

Referring to FIG. 7, only the first mask transfer part 310 may be formed on one side, that is, at the front of the substrate fixing part 900. That is, the first mask transfer part 310 and the substrate fixing part 900 can be arranged side by side in the movement direction of the deposition substrate 800. That is, the second mask transfer part is not provided in the fourth embodiment, differently from the first embodiment.

Here, the first mask transfer part 310 may be a mono-polar electrostatic chuck. As described above, in the case of a mono-polar electrostatic chuck, the deposition mask 200 functions as an electrode. Consequently, electrostatic force is generated by one electrode formed in the first mask transfer part 310 and the deposition mask 200 corresponding to another electrode.

According to the fourth exemplary embodiment, only the first auxiliary substrate 710 may be formed before the deposition substrate 800. For example, the first auxiliary substrate 710 and the deposition substrate 800 can be arranged side by side in the movement direction of the deposition substrate 800. That is, the second auxiliary substrate of the first exemplary embodiment is not provided in the fourth exemplary embodiment, differently from the first exemplary embodiment.

Here, the deposition substrate 800 and the first auxiliary substrate 710 are arranged side by side on the same plane.

The first auxiliary substrate 770 may be formed of the same material as the deposition substrate 800. However, the first auxiliary substrate 710 may be narrower than the deposition substrate 800.

A description will be given of a deposition apparatus according to a fifth exemplary embodiment with reference to FIG. 8. A detailed description of components identical or similar to those of the deposition apparatus according to the first exemplary embodiment is omitted.

Figure 8:
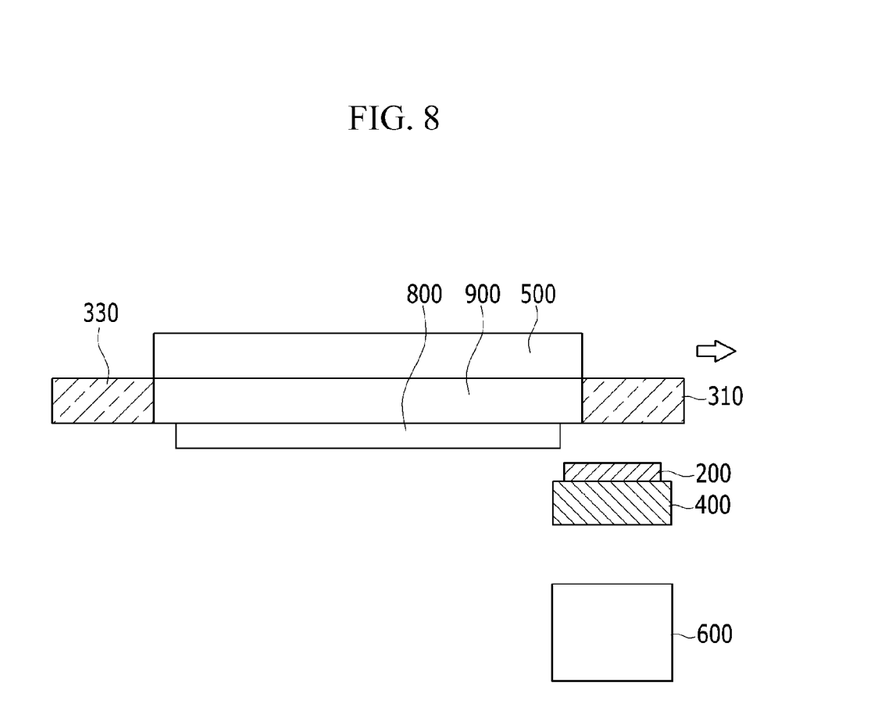
FIG. 8 is a front view of a deposition apparatus according to a fifth exemplary embodiment.

Referring to FIG. 8, in the deposition apparatus according to the fifth exemplary embodiment, the mask transfer part 300 may be formed on both sides of the substrate fixing part 900, as in the first exemplary embodiment. That is, the first and second mask transfer parts 310 and 330 can be respectively arranged before and behind the substrate fixing part 900 in the movement direction of the deposition substrate 800.

Here, the first and second mask transfer parts 310 and 330 may be mono-polar electrostatic chucks. As described above, in the case of a mono-polar electrostatic chuck, the deposition mask 200 functions as an electrode. Consequently, electrostatic force is generated by one electrode formed in the first and second mask transfer parts 310 and 330 and the deposition mask 200 corresponding to another electrode.

The auxiliary substrate is not provided in the fifth embodiment, differently from the first embodiment. That is, the auxiliary substrate is not arranged under the first and second mask transfer parts 310 and 330.

A description will be given of a deposition apparatus according to a sixth exemplary embodiment with reference to FIG. 9. A detailed description of components identical or similar to those of the deposition apparatus according to the first exemplary embodiment is omitted.

Figure 9:
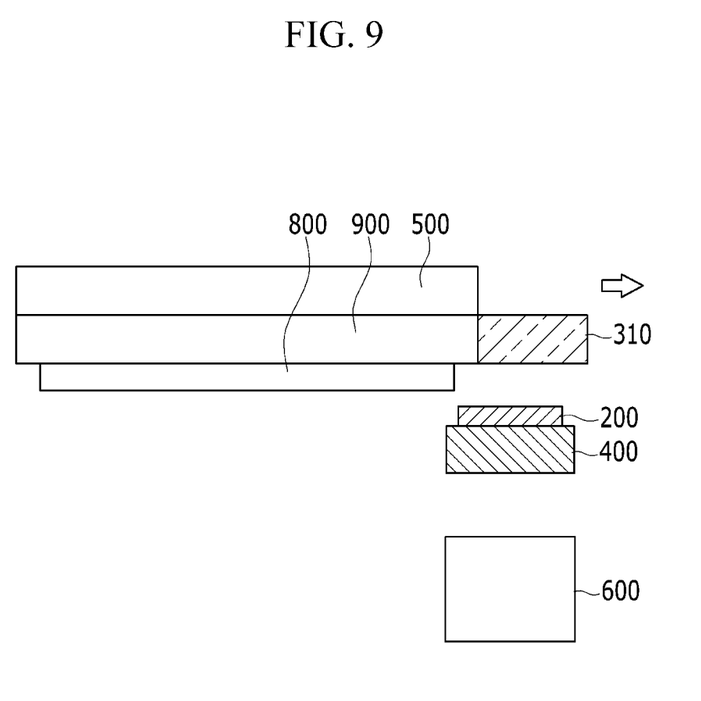
FIG. 9 is a front view of a deposition apparatus according to a sixth exemplary embodiment.

Referring to FIG. 9, only the first mask transfer part 310 may be formed on one side, that is, at the front of the substrate fixing part 900. That is, the first mask transfer part 310 and the substrate fixing part 900 can be arranged side by side in the movement direction of the deposition substrate 800. That is, the second mask transfer part is not provided in the sixth embodiment, differently from the first embodiment.

Here, the first mask transfer part 310 may be a mono-polar electrostatic chuck. As described above, in the case of a mono-polar electrostatic chuck, the deposition mask 200 functions as an electrode. Consequently, electrostatic force is generated by one electrode formed in the first mask transfer part 310 and the deposition mask 200 corresponding to another electrode.

The auxiliary substrate is not provided in the sixth exemplary embodiment, distinguished from the first exemplary embodiment. That is, the auxiliary substrate is not arranged under the first mask transfer part 310.

A description will be given of a deposition method using the deposition apparatus according to an exemplary embodiment. A detailed description of the same components as those of the aforementioned deposition apparatus is omitted.

Referring back to FIG. 2, the deposition substrate 800 is fixed to the lower part of the substrate fixing part 900. The substrate fixing part 900 fixes the deposition substrate 800 such that the deposition surface of the substrate on which a deposition material is deposited faces downwardly. During the deposition process, the deposition substrate 800 is fixed to the substrate fixing part 900 and moved in the horizontal direction.

Subsequently, the first mask transfer part 310 moves the deposition mask 200 upwardly to locate the deposition mask 200 under the first mask transfer part 310.

As shown in FIG. 3, the first mask transfer part 310 moves the deposition substrate 800 upwardly to a position spaced apart from the deposition substrate 800 by a predetermined distance before the deposition substrate 800 passes the deposition mask 200.

Since the deposition substrate 800 and the first auxiliary substrate 710 are arranged side by side on the same plane, the distance between the deposition substrate 800 and the deposition mask 200 is the same as the distance between the first auxiliary substrate 710 and the deposition mask 200.

Here, the first mask transfer part 310 can move the deposition mask 200 upwardly such that the deposition mask 200 closely contacts the first auxiliary substrate 710.

Here, the first mask transfer part 310 may be a mono-polar electrostatic chuck. As described above, in the case of a mono-polar electrostatic chuck, the deposition mask 200 functions as an electrode. Consequently, electrostatic force is generated by one electrode formed in the first mask transfer part 310 and the deposition mask 200 corresponding to another electrode.

As shown in FIG. 4, the substrate transfer part (not shown) moves the deposition substrate 800 in the horizontal direction. The substrate transfer part can move the deposition substrate 800 in the horizontal direction such that a deposition material is deposited on the deposition substrate 800 while the deposition substrate 800 passes over the deposition mask 200.

When the deposition substrate 800 passes over the deposition mask 200, the deposition source 600 jets the deposition material to the deposition substrate 800. The deposition material jetted from the deposition source 600 can form a predetermined pattern on the deposition substrate 800 while passing through the deposition mask 200.

When the deposition substrate 800 is moved by the substrate transfer part, the mask spacing part 500 maintains a uniform distance between the deposition substrate 800 and the deposition mask 200. If the distance between the deposition substrate 800 and the deposition mask 200 is not uniformly maintained when the deposition substrate 800 is moved, the thickness of a layer formed of the deposition material on the deposition substrate 800 is not uniform.

To prevent this, the mask spacing part 500 maintains a uniform distance between the deposition substrate 800 and the deposition mask 200. Here, the distance between the deposition substrate 800 and the deposition mask 200 may be the same as the distance between the first auxiliary substrate 710 and the deposition mask 200 since the deposition mask 200 is moved upwardly by the first mask transfer part 310.

That is, the deposition mask 200 can be moved upwardly by the first mask transfer part 310 and moved in the horizontal direction by the mask spacing part 500 while maintaining the same height.

Here, the mask spacing part 500 can maintain a uniform distance between the deposition mask 200 and the deposition substrate 800 using magnetic force. The mask spacing part 500 is a magnetic member and can maintain a uniform distance between the deposition mask 200 and the deposition substrate 800 by pulling the deposition mask made of a metal toward the deposition substrate 800.

After deposition of the deposition material on the deposition substrate 800, the second mask transfer part 330 can move the deposition mask 200 downwardly.

After the deposition substrate 800 passes over the deposition mask 200 while maintaining a predetermined distance from the deposition mask 200, the deposition mask 200 is located behind the substrate fixing part 900. Here, the second mask transfer part 330 moves the deposition mask 200 downwardly.

That is, the second mask transfer part 330 can move the deposition mask 200 to the original position after deposition of the deposition material on the deposition substrate 800.

Here, the second mask transfer part 330 may be a mono-polar electrostatic chuck, like the first mask transfer part 310. As described above, in the case of a mono-polar electrostatic chuck, the deposition mask 200 functions as an electrode. Consequently, electrostatic force is generated by one electrode formed in the second mask transfer part 330 and the deposition mask 200 corresponding to another electrode.

That is, the second mask transfer part 330 can move the deposition mask 200 downwardly by controlling electrostatic force.

According to at least one of the disclosed embodiments, it is possible to minimize variation in the deposition position and deposition thickness of a layer formed of a deposition material due to vibration of a metal mask in a deposition process using SMS applied to large substrates.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A deposition apparatus for manufacturing a display device, comprising:
    a substrate fixing portion configured to fix a deposition substrate, on which a deposition material is deposited, to a lower portion thereof;
    a first mask transfer portion placed on one side of the substrate fixing portion and configured to move a deposition mask upwardly such that the deposition mask is formed spaced apart from the deposition substrate by a predetermined distance;
    a substrate transfer portion configured to move the deposition substrate in a substantially horizontal direction such that the deposition substrate passes over the deposition mask, wherein the first mask transfer portion and the substrate fixing portion are arranged side by side in the horizontal movement direction of the deposition substrate;
    a mask spacing portion positioned on the substrate fixing portion and configured to maintain a substantially uniform distance between the deposition substrate and the deposition mask when the deposition substrate is moved; and
    a deposition source configured to deposit a deposition material on the deposition substrate through the deposition mask.

2. The deposition apparatus of claim 1, further comprising a first auxiliary substrate formed under the first mask transfer portion and arranged side by side with the deposition substrate.

3. The deposition apparatus of claim 2, wherein the first auxiliary substrate is formed of the same material as the deposition substrate.

4. The deposition apparatus of claim 2, wherein the first auxiliary substrate is formed between the first mask transfer portion and the deposition mask.

5. The deposition apparatus of claim 1, wherein the substrate fixing portion comprises a bipolar electrostatic chuck or a mono-polar electrostatic chuck.

6. The deposition apparatus of claim 1, wherein the mask spacing portion is configured to maintain the distance based on magnetic force.

7. The deposition apparatus of claim 1, wherein the substrate fixing portion has a larger area than the deposition substrate.

8. The deposition apparatus of claim 1, further comprising first and second auxiliary substrates formed on opposing sides of the deposition substrate.

9. The deposition apparatus of claim 8, wherein the thicknesses of the first and second auxiliary substrates are substantially the same as that of the deposition substrate.

10. The deposition apparatus of claim 1, wherein the first mask transfer portion directly contacts the substrate fixing portion.

11. A deposition apparatus for manufacturing a display device, comprising:
    a substrate fixing portion configured to fix a deposition substrate, on which a deposition material is deposited, to a lower portion thereof;
    a first mask transfer portion placed on one side of the substrate fixing portion and configured to move a deposition mask upwardly such that the deposition mask is formed spaced apart from the deposition substrate by a predetermined distance;
    a substrate transfer portion configured to move the deposition substrate in a substantially horizontal direction such that the deposition substrate passes over the deposition mask;
    a mask spacing portion positioned on the substrate fixing portion and configured to maintain a substantially uniform distance between the deposition substrate and the deposition mask when the deposition substrate is moved;
    a deposition source configured to deposit a deposition material on the deposition substrate through the deposition mask; and
    a second mask transfer portion formed on another side of the substrate fixing portion and configured to move the deposition mask downwardly from the deposition substrate.

12. The deposition apparatus of claim 11, wherein the first and second mask transfer portions are respectively located on front and rear sides of the deposition substrate in a movement direction of the deposition substrate.

13. The deposition apparatus of claim 11, further comprising a second auxiliary substrate formed under the second mask transfer portion and arranged side by side with the deposition substrate.

14. The deposition apparatus of claim 13, wherein the second auxiliary substrate is formed of the same material as the deposition substrate.

15. The deposition apparatus of claim 11, wherein the second mask transfer portion comprises a mono-polar electrostatic chuck.

* * * * *